United States Patent
Arimura et al.

(10) Patent No.: US 7,012,558 B1
(45) Date of Patent: Mar. 14, 2006

(54) A/D CONVERTER, BATTERY PACK, ELECTRONICS DEVICE AND METHOD OF VOLTAGE MEASUREMENT

(75) Inventors: Kazuyoshi Arimura, Kasugai (JP);
Atsushi Hayakawa, Kasugai (JP);
Hidekiyo Ogawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/023,593

(22) Filed: Dec. 29, 2004

(30) Foreign Application Priority Data

Oct. 20, 2004 (JP) .............................. 2004-305954

(51) Int. Cl.
*H03M 1/12* (2006.01)
(52) U.S. Cl. ....................................... 341/155; 341/120
(58) Field of Classification Search ................ 341/155, 341/144, 139, 120, 118, 143; 330/253, 292; 327/91

See application file for complete search history.

(56) References Cited

U.S. PATENT DOCUMENTS

| | | | |
|---|---|---|---|
| 6,002,355 A | * | 12/1999 | Del Signore et al. ........ 341/155 |
| 6,069,577 A | * | 5/2000 | Morisson et al. ............ 341/120 |
| 6,400,220 B1 | * | 6/2002 | Wang et al. .................... 330/9 |
| 6,442,213 B1 | * | 8/2002 | Krone et al. ................. 375/285 |
| 6,614,373 B1 | * | 9/2003 | Frazier ........................ 341/143 |
| 6,667,707 B1 | * | 12/2003 | Mueck et al. ................ 341/172 |

FOREIGN PATENT DOCUMENTS

JP 06-090914 4/1994

\* cited by examiner

*Primary Examiner*—Brian Young
(74) *Attorney, Agent, or Firm*—Arent Fox, PLLC.

(57) ABSTRACT

An amplifying circuit amplifies and outputs voltage difference between first external input voltage and voltage corresponding to second external input voltage. An A/D converting circuit converts the output voltage of the amplifying circuit into a digital value by comparing it with reference voltage, and outputs it. A bias circuit selects the second external input voltage or voltage obtained by adding bias voltage to the second external input voltage, according to the output voltage of the amplifying circuit, and outputs it as the voltage corresponding to second external input voltage. A first storing circuit prestores a measured value of the bias voltage, and outputs the stored value as a digital value whose bit number is greater than that of the digital value from the A/D converting circuit, when the voltage corresponding to second external input voltage is the voltage obtained by adding the bias voltage to the second external input voltage.

41 Claims, 11 Drawing Sheets

A/D CONVERTER, BATTERY PACK, ELECTRONICS DEVICE AND METHOD OF VOLTAGE MEASUREMENT

CROSS-REFERENCE TO RELATED APPLICATIONS

This application is based upon and claims the benefit of priority from Japanese Patent Application No. 2004-305954, filed on Oct. 20, 2004, the entire contents of which are incorporated herein by reference.

BACKGROUND OF THE INVENTION

1. Field of the Invention

The present invention relates to an A/D converter, a battery pack, an electronics device and a method of voltage measurement and, more particularly, to technology which uses the A/D converter for measuring a voltage difference between both ends of a resistor element inserted in a current path in series, with the aim of current measurement.

2. Description of the Related Art

When a portable electronics device (a notebook personal computer, an electronic notebook or the like) is operated by a commercial power supply via an AC adapter or the like, the power supply is not interrupted during its operation. Meanwhile, when the portable electronics device is operated by a battery, there is the possibility of losing data under processing if a battery remaining capacity is used up and the power supply is interrupted during its operation. Therefore, a battery remaining capacity managing system for managing the battery remaining capacity is usually mounted on the portable electronics device.

In order to manage (predict) the battery remaining capacity, it is necessary to measure a current value of a current flowing out from the battery (a discharging current) or a current flowing into the battery (a charging current). A typical method of current measurement is to measure a voltage difference between both ends of a resistor element inserted in a current path in series, and determine the current value of the current path using the measured result and a resistor value of the resistor element. The battery remaining capacity managing system employs an A/D converter for measuring the voltage difference between both ends of the resistor element, and a microcontroller for determining the current value of the current path based on a digital value from the A/D converter (result of A/D conversion), in order to measure the current value of the current path.

Moreover, according to japanese Patent Application Laid-open No. Hei 6-90914, the technology is disclosed that a differential amplifier is provided at a pre-stage of an A/D converting circuit in order to eliminate DC noise included in an input signal to be subjected to A/D conversion, so that an overflow of the A/D converting circuit is prevented by applying the input signal to a non-inverting input terminal of the differential amplifier and applying a bias voltage to an inverting input terminal of the differential amplifier.

Current consumption of the portable electronics device varies significantly according to an operating state of the electronics device. For example, when the electronics device is in a stand-by state, its current consumption is as small as a leak current of an internal circuit (about 1 mA), which is extremely small. Meanwhile, when the electronics device is operating with a maximum load, its current consumption can be approximately 10 A. Therefore, in such a case, a current measuring circuit must be able to measure the current from 1 mA to 10 A, meaning that a dynamic range (a measurable range) of 10000 times is required. Since 14 bits are necessary to express the current from 1 mA to 10 A in a digital value, a 14-bit A/D converter is required for the current measuring circuit.

The A/D converter converts an input voltage into a digital value based on a ratio between the input voltage and a reference voltage. Therefore, a digital value Do of the 14-bit A/D converter can be expressed by the following expression (1), using an input voltage Vi and a reference voltage Vr.

$$Do = (Vi/Vr) \times 16384 \quad (1)$$

Minimum resolution of the 14-bit A/D converter is expressed by Vr/16384. It is 300 $\mu$V when the reference voltage Vr is 5.0 V, and 183 $\mu$V when the reference voltage Vr is 3.0 V. Hence, it is technically difficult to form the 14-bit A/D converter. Meanwhile, it is relatively easy to form a 10-bit A/D converter since minimum resolution of the 10-bit A/D converter is 29.3 mV when the reference voltage Vr is 3.0 V. However, a dynamic range (a convertible range) of the 10-bit A/D converter is only about 1000 times.

Supposing that the 14-bit A/D converter can be technically formed, a resistor value of a resistor element required to generate a voltage difference of 300 $\mu$V between both ends of the resistor element is 300 m$\Omega$, when a current of 1 mA is flowing through the current path. When a current of 10 A is flowing through the current path, the voltage difference which is generated between both ends of the resistor element of 300 m$\Omega$ is 3.0 V, and power loss at this time is as much as 30 W. Therefore, the resistor value of the resistor element which is inserted in the current path in series needs to be small enough. In consideration of allowable power loss, the resistor value of the resistor element which can be used realistically has the limits of 3 to 5 m$\Omega$. The voltage difference generated between both ends of the resistor element of 3 to 5 m$\Omega$ is 3 to 5 $\mu$V when a current of 1 mA is flowing through the current path, and is 30 to 50 mV when a current of 10 A is flowing through the current path. Since it is not realistic to make such a minute voltage to be the input voltage of the A/D converter, an amplifier for amplifying the voltage difference generated between both ends of the resistor element and outputting it to the A/D converter is provided at a pre-stage of the A/D converter.

In general, in order to form the A/D converter with relative ease, it is preferable to form it with its minimum resolution being about 3 mV. When a current of 1 mA is flowing through the current path, the voltage difference generated between both ends of a resistor element of 3 m$\Omega$ is 3 $\mu$V, and hence an amplifying factor of the amplifier needs to be approximately 1000 times. However, when a current of 10 A is flowing through the current path, the voltage difference generated between both ends of the resistor element of 3 m$\Omega$ is 30 mV, and hence an output voltage of the amplifier is as much as 300 V. Thus, it is necessary to increase an output bit number of the A/D converter (a bit number of the digital value obtained by A/D conversion) in order to increase the dynamic range of the A/D converter, but, when the bit number is increased, it is quite difficult to realize both of accuracy in the minimum resolution and increase of the dynamic range of the A/D converter.

According to Japanese Patent Application Laid-open No. Hei 6-90914, a dynamic range may be considered to be increased from the perspective that the overflow of the A/D converting circuit due to the DC noise is prevented, but a bit number of a digital value obtained by A/D conversion is not increased, and therefore the increase of the dynamic range is not realized consequently.

SUMMARY OF THE INVENTION

It is an object of the present invention to realize both of accuracy in minimum resolution and increase of a dynamic range with simple circuitry, without increasing an output bit number of an A/D converting circuit.

According to a mode of the present invention, an amplifying circuit of an A/D converter amplifies a voltage difference between a first external input voltage and a voltage corresponding to a second external input voltage, and outputs it. An A/D converting circuit of the A/D converter converts the output voltage of the amplifying circuit into a digital value by making a comparison with a reference voltage, and outputs it. A bias circuit of the A/D converter selects either the second external input voltage or a voltage obtained by adding a bias voltage to the second external input voltage, according to the output voltage of the amplifying circuit, in order to prevent the output voltage of the amplifying circuit from falling outside an A/D convertible range of the A/D converting circuit, and outputs it as the voltage corresponding to the second external input voltage. A first storing circuit of the A/D converter, in which a measured value of the bias voltage is stored in advance, outputs the stored measured value as a digital value whose bit number is greater than that of the digital value from the A/D converting circuit, when the voltage corresponding to the second external input voltage is the voltage obtained by adding the bias voltage to the second external input voltage. For example, the A/D converter is mounted on an electronics device which includes a current measuring circuit for determining a current value of a current path based on the digital value from the A/D converter, or a battery pack of the electronics device including the current measuring circuit, in order to measure a voltage difference between both ends of a resistor element inserted in a current path in series.

According to such an A/D converter, the bias circuit is provided so that the input voltage of the A/D converting circuit (the output voltage of the amplifying circuit) is prevented from falling outside the A/D convertible range of the A/D converting circuit during A/D conversion, even when the voltage difference between both ends of the resistor element fluctuates significantly, in other words, when the current value of the current path fluctuates significantly. Moreover, the current measuring circuit adds the digital value from the A/D converting circuit and the digital value from the first storing circuit, thereby correcting a voltage shift amount by the bias circuit, and obtaining a digital value showing the voltage difference between both ends of the resistor element. Thus, an apparent bit number of the digital value from the A/D converter is increased without increasing the output bit number of the A/D converting circuit, so that both of the accuracy in the minimum resolution and the increase of the dynamic range can be realized.

According to a preferred example of the mode of the present invention, a second storing circuit of the A/D converter, in which a measured value of the reference voltage is stored in advance, outputs the stored measured value as a digital value. For example, in a fabrication process of the A/D converter, the reference voltage is measured at a predetermined temperature, and the measured value is stored in the second storing circuit. The current measuring circuit can obtain the measured value of the reference voltage which corresponds to a voltage value of the reference voltage during A/D conversion. Therefore, the current measuring circuit corrects the digital value from the A/D converting circuit by using the digital value from the second storing circuit, so that the digital value accurately showing the output voltage of the amplifying circuit can be obtained, irrespective of accuracy of the reference voltage. As a result of this, the current measuring circuit corrects the digital value from the A/D converting circuit by using the digital value from the second storing circuit and thereafter adds the digital value from the first storing circuit thereto, thereby obtaining the digital value accurately showing the voltage difference between both ends of the resistor element (the current value of the current path).

According to a preferred example of the mode of the present invention, the bias circuit selects the bias voltage to be added to the second external input voltage out of a plurality of bias voltages according to the output voltage of the amplifying circuit. The first storing circuit stores measured values of the plurality of bias voltages in advance, selects the measured value of the bias voltage selected by said bias circuit, and outputs it as the digital value. By providing the plurality of bias voltages, it is possible to further increase the dynamic range of the A/D converter.

According to a preferred example of the mode of the present invention, a measurement voltage generating circuit of the A/D converter generates a measurement voltage for measuring temperature which fluctuates in response to ambient temperature around the A/D converter. A selecting circuit of the A/D converter selects and outputs the measurement voltage and thereafter the output voltage of the amplifying circuit as an input voltage of the A/D converting circuit. A holding circuit of the A/D converter holds the digital value which is output from the A/D converting circuit in association with the selection of the measurement voltage by the selecting circuit. The first storing circuit stores the measured values of the plurality of bias voltages at every ambient temperature around the A/D converter in advance, selects the measured value corresponding to the digital value held by the holding circuit, out of the measured values of the bias voltages selected by the bias circuit, and outputs it as a digital value. Accordingly, the digital value from the first storing circuit shows the measured value of the bias voltage corresponding to the current ambient temperature around the A/D converter. Therefore, the current measuring circuit can obtain the digital value accurately showing the voltage difference between both ends of the resistor element (the current value of the current path) at all times, even when the bias voltage fluctuates according to fluctuation of the ambient temperature around the A/D converter.

According to a preferred example of the mode of the present invention, a second storing circuit, in which the measured values of the reference voltage at every ambient temperature around the A/D converter are stored in advance, selects the measured value corresponding to the digital value held by the holding circuit, and outputs it as a digital value. Accordingly, the digital value from the second storing circuit shows the measured value of the reference voltage corresponding to the current ambient temperature around the A/D converter. Therefore, the current measuring circuit can obtain the digital value accurately showing the input voltage of the A/D converting circuit (the output voltage of the amplifying circuit) at all times, even when the reference voltage fluctuates according to the ambient temperature around the A/D converter.

According to a preferred example of the mode of the present invention, a third storing circuit of the A/D converter, in which a standard value of the reference voltage is stored in advance, outputs the stored standard value as a digital value. A correcting circuit of the A/D converter corrects the digital value from the A/D converting circuit to be a digital value which is based on the standard value of the reference voltage, in accordance with the digital values from the second and third storing circuits, and outputs it. An adding circuit of the A/D converter adds the digital value from the correcting circuit and the digital value from the first storing circuit, and outputs the added result. Thereby, it is possible to eliminate the need for the operation of the current measuring circuit correcting the digital value from the A/D converting circuit by using the digital value from the second storing circuit, and adding the corrected digital value and the digital value from the first storing circuit. Therefore, it is possible to simplify a control program of the current measuring circuit which is constituted with a microcontroller or the like.

According to a preferred example of the mode of the present invention, an adding circuit of the A/D converter adds the digital value from the A/D converting circuit and the digital value from the first storing circuit, and outputs the added result. Thereby, it is possible to eliminate the need for the operation of the current measuring circuit adding the digital value from the A/D converting circuit and the digital value from the first storing circuit. Therefore, it is possible to simplify the control program of the current measuring circuit which is constituted with the microcontroller or the like.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
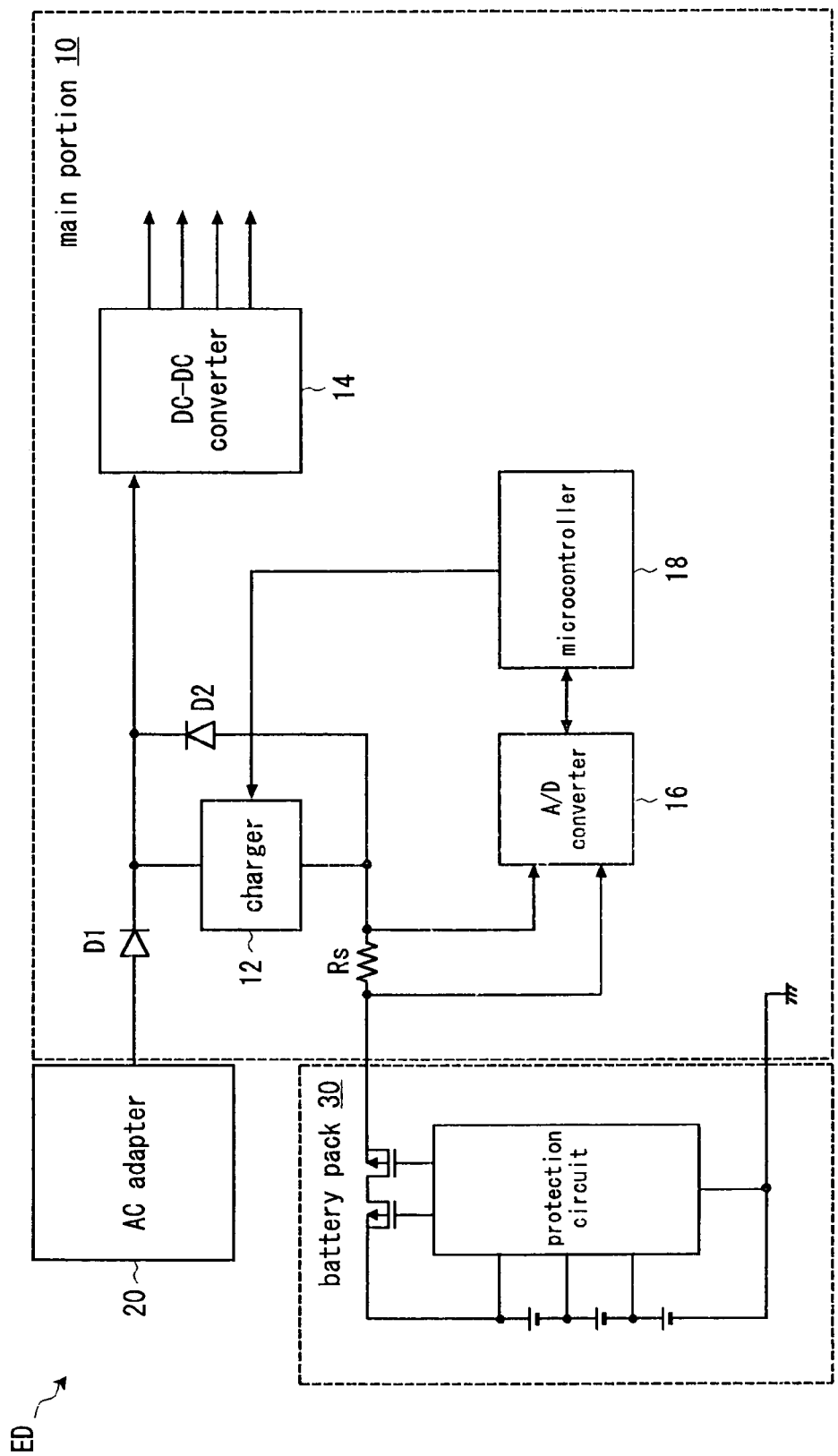
FIG. 1 is a block diagram showing a first embodiment of the present invention.

Hereinafter, preferred embodiments of the present invention will be explained with reference to the drawings. FIG. 1 shows a first embodiment of the present invention. A portable electronics device (a notebook personal computer, for example) ED includes a main portion 10, an AC adapter 20, and a battery pack 30. The main portion 10 includes a charger 12, a DC—DC converter 14, an A/D converter 16, a microcontroller 18, a resistor Rs, and diodes D1 and D2. The diode D1 is a backflow preventing circuit which prevents power supplied from the battery pack 30 from being supplied to the AC adapter 20 side. The diode D2 is a backflow preventing circuit which prevents power supplied from the AC adapter 20 from being supplied to the battery back 30 side.

The charger 12 follows an instruction from the microcontroller 18 to charge the battery pack 30 using the power supplied from the AC adapter 20. The DC—DC converter 14 uses the power supplied from the AC adapter 20 or the battery pack 30 to generate voltages required by internal circuits such as a CPU (not shown), and output it. The resistor Rs is a current sense resistor which measures a current flowing from the battery pack 30 to the DC—DC converter 14 or a current flowing from the charger 12 to the battery pack 30. The A/D converter 16 is provided for measuring a voltage difference between both ends of the resistor Rs. The microcontroller 18 (a current measuring circuit) is a circuit for predicting a battery remaining capacity of the battery pack 30, based on a digital value from the A/D converter 16.

The AC adapter 20 is an external power supply for supplying power to the main portion 10 by converting a commercial power supply into a DC voltage. The battery pack 30 is a power supply for supplying power to the main portion 10 when the power is not supplied from the AC adapter 20. The battery pack 30 is constituted by including a plurality of battery cells (lithium secondary batteries, for example), a protection circuit and a switching circuit (a FET, for example) for preventing overcharging and over-discharging.

Figure 2:
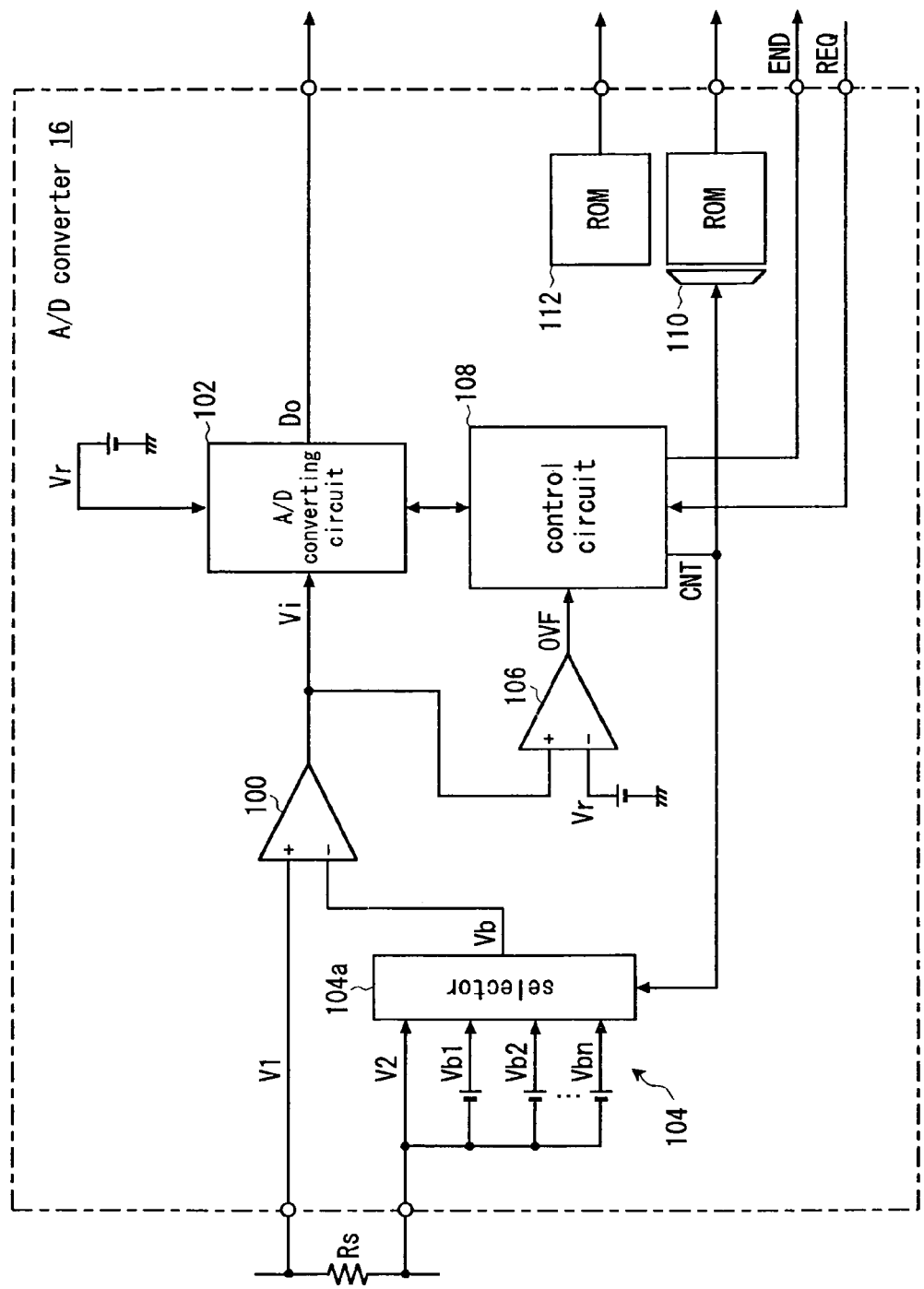
FIG. 2 is a block diagram showing an A/D converter shown in FIG. 1.
Figure 3:
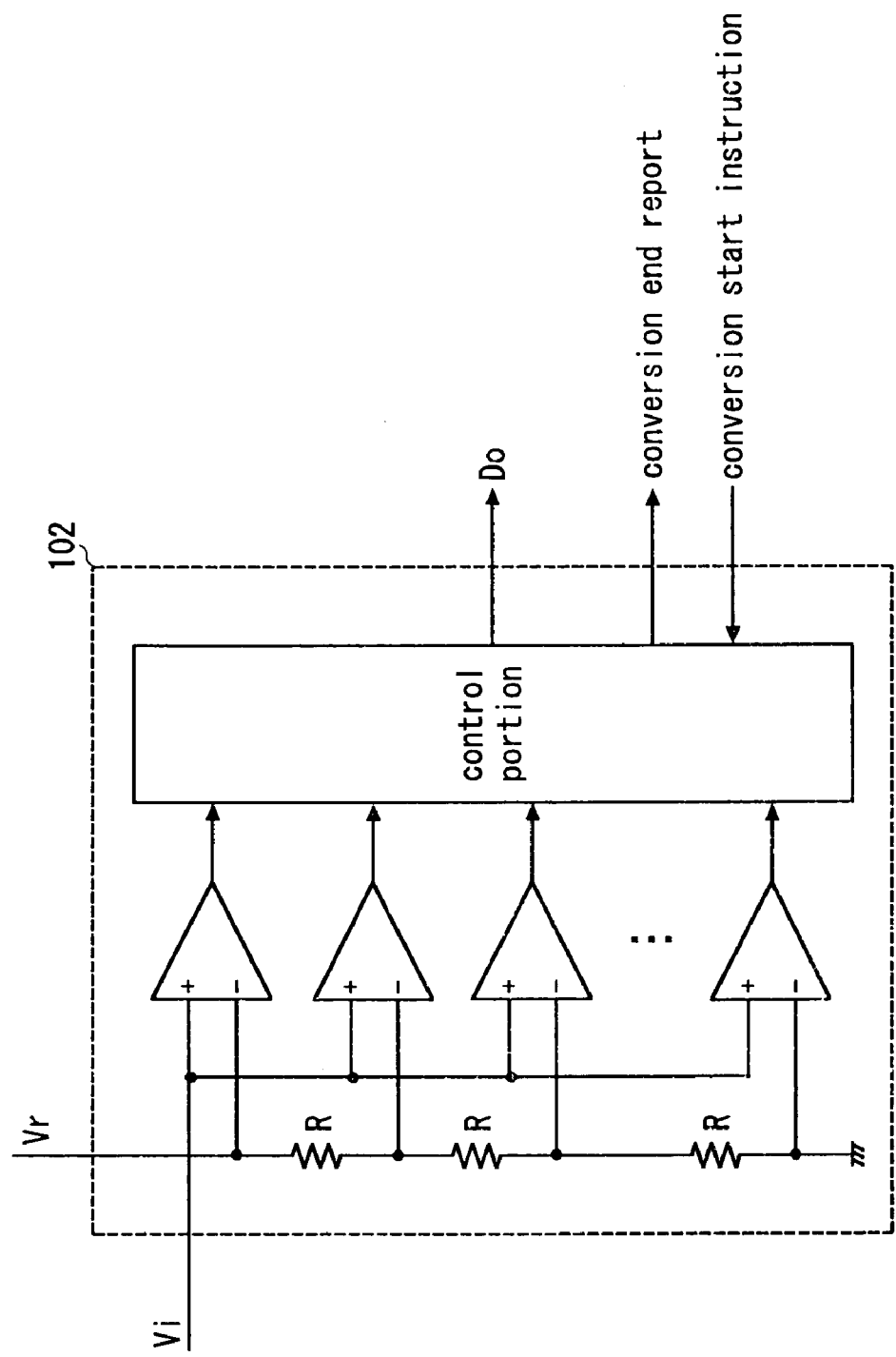
FIG. 3 is a block diagram showing an example of an A/D converting circuit shown in FIG. 2.
Figure 4:
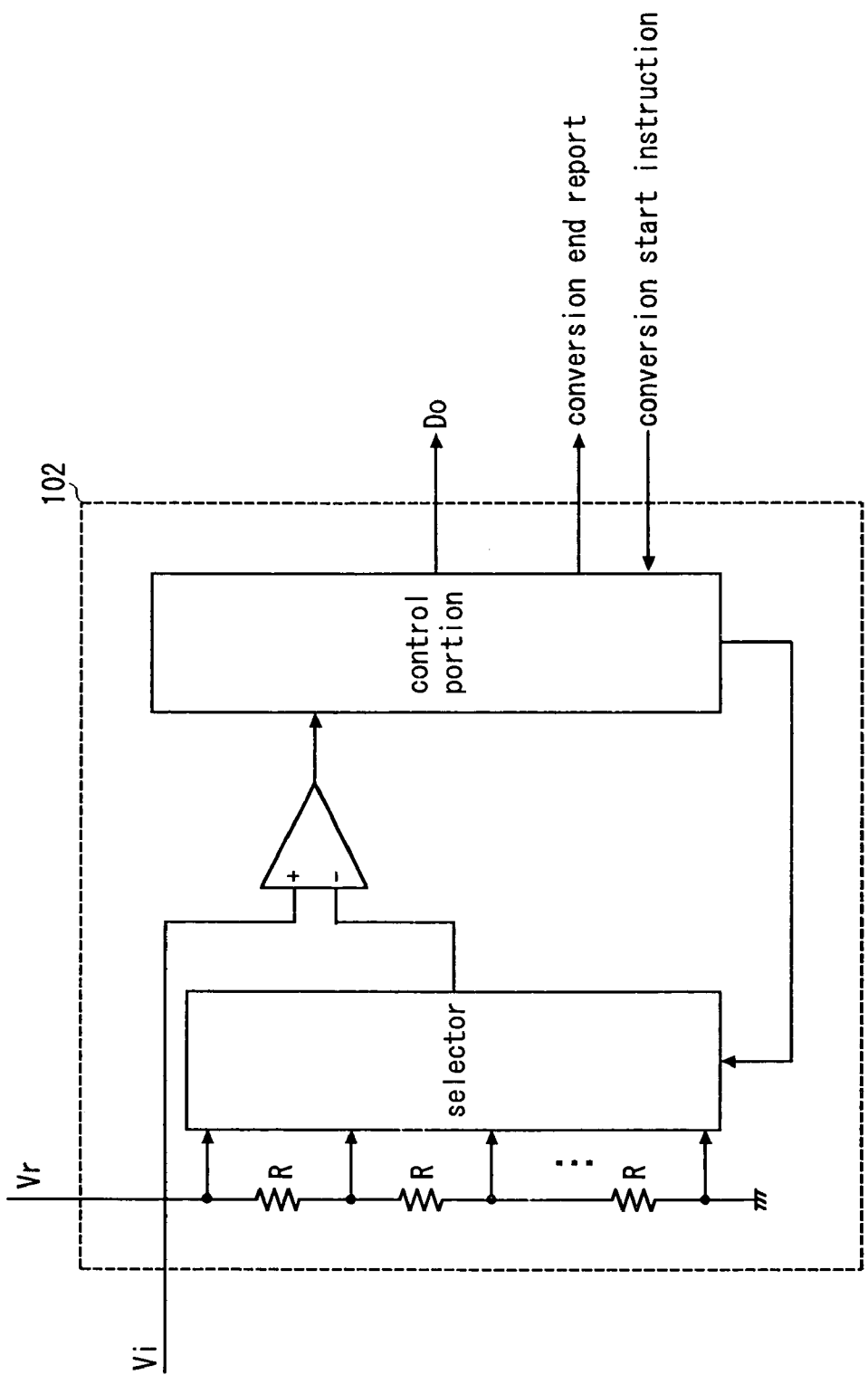
FIG. 4 is a block diagram showing another example of the A/D converting circuit shown in FIG. 2.
Figure 5:
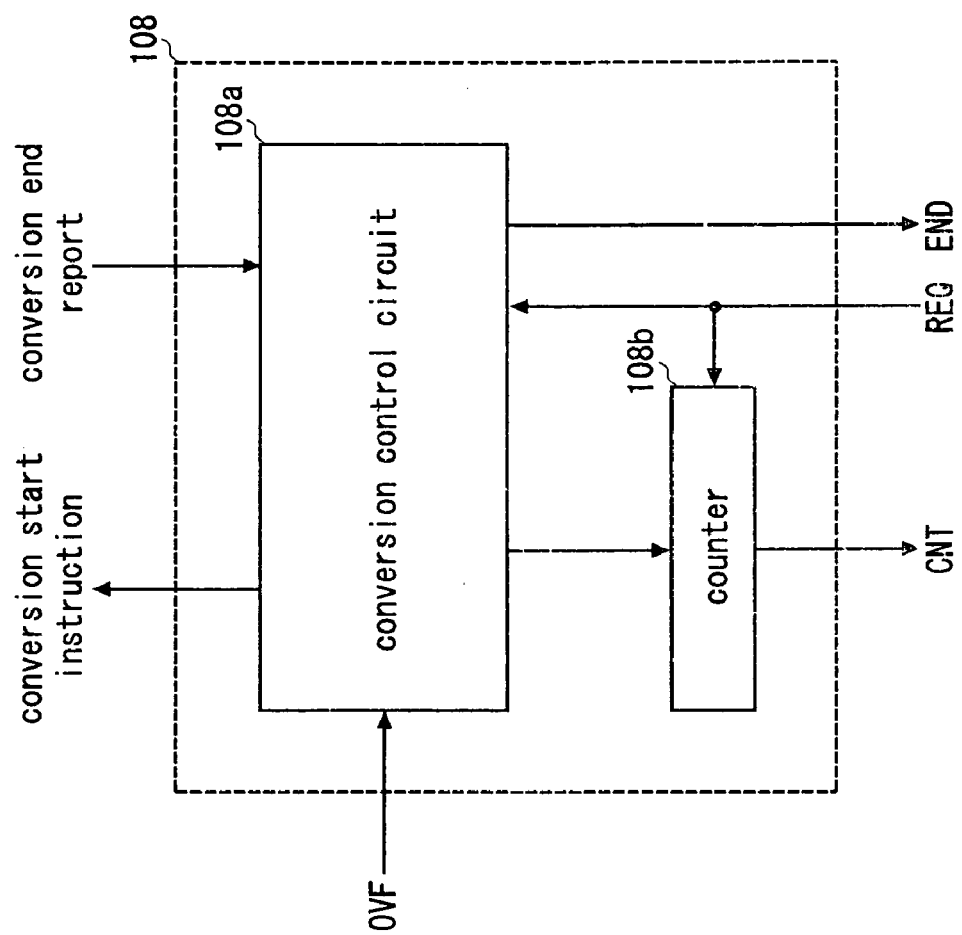
FIG. 5 is a block diagram showing an example of a control circuit shown in FIG. 2.

FIG. 2 shows the A/D converter 16 shown in FIG. 1. Each of FIG. 3 and FIG. 4 shows an example of an A/D converting circuit 102 shown in FIG. 2. FIG. 5 shows an example of a control circuit 108 shown in FIG. 2. The A/D converter 16 is constituted as a semiconductor integrated circuit chip, for example, and includes an amplifier 100 (an amplifying circuit), the A/D converting circuit 102, a bias circuit 104, a voltage comparator 106, the control circuit 108, a ROM 110 (a first storing circuit), and a ROM 112 (a second storing circuit).

The amplifier 100 receives a voltage V1 (a first external input voltage) on one end side of the resistor Rs (the upper side in the drawing) at a non-inverting terminal (a positive terminal), and an output voltage Vb of the bias circuit 104 (a selector 104a) at an inverting input terminal (a negative terminal). The amplifier 100 amplifies a voltage difference between the voltage V1 on one end side of the resistor Rs and the output voltage Vb of the bias circuit 104 and outputs it to the A/D converting circuit 102 and the voltage comparator 106.

The A/D converting circuit 102 follows an instruction from the control circuit 108 to convert an input voltage Vi (the output voltage of the amplifier 100) into a 10-bit digital value Do by making a comparison with a reference voltage Vr, and output it to the microcontroller 18 (FIG. 1). The A/D converting circuit 102 is constituted by adopting, for example, a well-known parallel conversion system (a flash conversion system) as shown in FIG. 3. Incidentally, the A/D converting circuit 102 may be constituted by adopting a well-known sequential conversion system as shown in FIG. 4 or other conversion systems.

The bias circuit 104 is constituted with voltage generating circuits, being n in number, for respectively generating voltages Vb1 to Vbn, each of which is a voltage V2 (a second external input voltage) on the other end side of the resistor Rs (the lower side in the drawing) added with respective bias voltages being different from each other, and the selector 104a. The selector 104a responds to a counter value signal CNT output from the control circuit 108 to select any one of the voltage V2 and the voltages Vb1 to Vbn, and output it as the output voltage Vb to the amplifier 100.

The voltage comparator 106 compares the input voltage Vi of the A/D converting circuit 102 (the output voltage of the amplifier 100) with the reference voltage Vr and, when the input voltage Vi of the A/D converting circuit 102 is higher than the reference voltage Vr, causes an output signal OVF to make a transition from its low level to its high level. More specifically, the high level of the output signal OVF of the voltage comparator 106 means that the input voltage Vi of the A/D converting circuit 102 is out of an A/D convertible range. Incidentally, the output signal OVF of the voltage comparator 106 does not change to the high level during A/D converting operation of the A/D converting circuit 102, as will be described later.

The control circuit 108 includes, for example, a conversion control circuit 108a and a counter 108b, as shown in FIG. 5. The conversion control circuit 108a responds to activation of a conversion request signal REQ output from the microcontroller 18 (FIG. 1) to instruct the A/D converting circuit 102 to start conversion. Moreover, the conversion control circuit 108a responds to the transition of the output signal OVF of the voltage comparator 106 from the low level to the high level (a rising edge) to instruct the counter 108b to count up.

Following the instruction from the conversion control circuit 108a, the counter 108b counts up and outputs the counter value signal CNT showing its counter value to the ROM 110 and the bias circuit 104. Further, the counter 108b is initialized in response to, for example, the activation of the conversion request signal REQ. It should be noted that the selector 104a of the bias circuit 104 outputs the voltage V2 as the output voltage Vb when the counter value signal CNT shows its initial value and, each time the value shown by the counter value signal CNT is incremented by one, it successively selects one from the voltages Vb1 to Vbn and outputs it as the output voltage Vb.

The ROM 110 is a nonvolatile memory such as a fuse and an EEPROM, in which n-pieces of 14-bit digital values corresponding respectively to the n bias voltages of the bias circuit 104 and a 14-bit digital value corresponding to the voltage V2, all of whose bits are "0", are stored in advance. For example, each of the digital values stored in the ROM 110 shows the value multiplying a measured value of the corresponding bias voltage by an amplification factor of the amplifier 100. The ROM 110 selects the digital value corresponding to the value shown by the counter value signal CNT output from the counter 108b of the control circuit 108, that is, the digital value corresponding to any one of the voltage Vb1 to Vbn selected by the selector 104a of the bias circuit 104, and outputs it to the microcontroller 18 (FIG. 1).

The ROM 112 is a nonvolatile memory such as a fuse and an EEPROM, similarly to the ROM 110. It stores a 10-bit digital value showing a measured value of the reference voltage Vr in advance, and outputs the stored digital value to the microcontroller 18 (FIG. 1). It should be noted that, although not illustrated, the A/D converter 16 includes, for example, monitoring pads for monitoring the reference voltage Vr, the voltages Vb1 to Vbn, and the output voltage Vi of the amplifier 100, respectively, and writing pads and writing circuits for writing data into the ROMs 110 and 112. The measured value of the reference voltage Vr and the measured values of the voltages Vb1 to Vbn (corresponding to the measured values of the bias voltages) at a predetermined temperature are obtained via the monitoring pads during a probe inspection in a fabrication process of the A/D converter 16. The value multiplying the measured value of each bias voltage by the amplification factor of the amplifier 100 is written into the ROM 110, and the measured value of the reference voltage Vr is written into the ROM 112, via the writing pads and the writing circuits. Incidentally, the amplification factor of the amplifier 100 is determined based on the measured value of the output voltage Vi of the amplifier 100 which is obtained via the monitoring pad.

Now, operation of the A/D converter 16 and the microcontroller 18 (a method of voltage measurement) will be explained. When the microcontroller 18 activates the conversion request signal REQ, the counter 108b of the control circuit 108 is initialized, and hence the selector 104a of the bias circuit 104 selects the voltage V2 on the other end side of the resistor Rs and outputs it to the amplifier 100. At this time, when the output signal OVF of the voltage comparator 106 is at the low level, the conversion control circuit 108a of the control circuit 108 instructs the A/D converting circuit 102 to start conversion.

Meanwhile, when the output signal OVF of the voltage comparator 106 is at the high level, the conversion control circuit 108a instructs the counter 108b to count up. When the counter 108b counts up, the selector 104a selects the voltage Vb1 which is the voltage V2 on the other end side of the resistor Rs added with the bias voltage, and outputs it to the amplifier 100. After such operation is repeated until the output signal OVF of the voltage comparator 106 makes a transition from the high level to the low level, the conversion control circuit 108a instructs the A/D converting circuit 102 to start conversion. Thereby, the A/D converting circuit 102 starts A/D conversion and, when the A/D conversion ends, reports that effect to the conversion control circuit 108a, and outputs the digital value Do (the A/D conversion result) to the microcontroller 18. In receiving the conversion end report from the A/D converting circuit 102, the conversion control circuit 108a activates a conversion end signal END.

In response to the activation of the conversion end signal END, the microcontroller 18 corrects the digital value Do from the A/D converting circuit 102 (the A/D conversion result) by using the digital value from the ROM 112 (the measured value of the reference voltage Vr). When, for example, a standard value of the reference voltage Vr is 5.0 V, a voltage value of the input voltage Vi of the A/D converting circuit 102 is 1.25 V, and a voltage value of the reference voltage Vr during the A/D conversion is 4.9 V, the digital value Do from the A/D converting circuit 102 is found to be 261. Further, the digital value output from the ROM 112 (the measured value of the reference voltage Vr) is 1003 showing 4.9 V. Therefore, the microcontroller 18 corrects the digital value Do (261) from the A/D converting circuit 102 based on a ratio between the standard value (1024) and the measured value (1003) of the reference voltage Vr, thereby obtaining a digital value (256) accurately showing the input voltage Vi (1.25 V).

Thereafter, the microcontroller 18 adds the corrected digital value and the digital value from the ROM 110 (the value multiplying the measured value of the bias voltage which is selected by the bias circuit 104 by the amplification factor of the amplifier 100), thereby determining the voltage difference between both ends of the resistor Rs. The microcontroller 18 finds a current value flowing through the resistor Rs based on the found voltage difference and a resistor value of the resistor Rs and integrates it to predict the battery remaining capacity of the battery pack 30.

Thus, according to the first embodiment, the bias circuit 104 is provided to prevent the input voltage Vi of the A/D converting circuit 102 (the output voltage of the amplifier 100) from falling outside the A/D convertible range during the A/D conversion, even when the voltage difference between both ends of the resistor Rs fluctuates significantly. Moreover, the microcontroller 18 can obtain the measured value of the reference voltage Vr which corresponds to the voltage value of the reference voltage Vr during the A/D conversion. Hence, the microcontroller 18 corrects the digital value from the A/D converting circuit 102 by using the digital value from the ROM 112, so that the digital value accurately showing the output voltage of the amplifier 100 can be obtained, irrespective of accuracy of the reference voltage Vr.

Furthermore, the microcontroller 18 adds the corrected digital value and the digital value from the ROM 110, thereby correcting a voltage shift amount by the bias circuit 104 and obtaining the digital value showing the voltage difference between both ends of the resistor Rs. Thus, an apparent bit number of the digital value from the A/D converter 16 is increased without increasing the output bit number of the A/D converting circuit 102, so that both of accuracy in minimum resolution and increase of a dynamic range can be realized.

Figure 6:
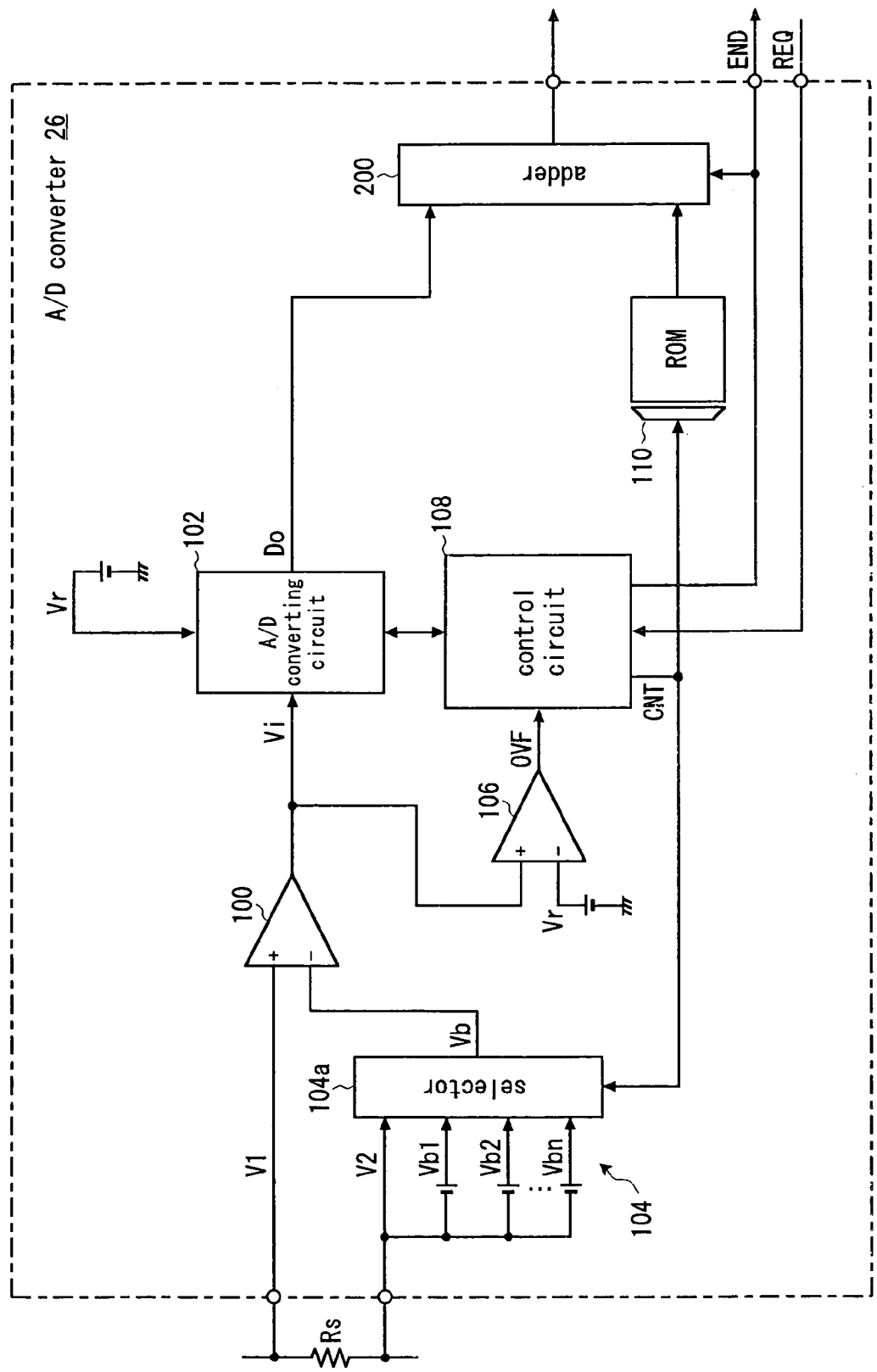
FIG. 6 is a block diagram showing a second embodiment of the present invention.

FIG. 6 shows a second embodiment of the present invention. In explaining the second embodiment, the same numerals and symbols are given to designate elements which are the same as those explained in the first embodiment, and detailed explanations thereof will be omitted. An A/D converter 26 is, for example, constituted as a semiconductor integrated circuit chip and is mounted on a main portion of a notebook personal computer, similarly to the A/D converter 16 in the first embodiment (FIG. 2).

The A/D converter 26 is constituted by removing the ROM 112 from and adding an adder 200 to the A/D converter 16 in the first embodiment. The adder 200 responds to activation of a conversion end signal END output from a control circuit 108 to add a 10-bit digital value Do output from an A/D converting circuit 102 and a 14-bit digital value output from a ROM 110, and output the added result as a 14-bit digital value to a microcontroller 18 (FIG. 1). When a voltage value of a reference voltage Vr is stabilized at a standard value, the digital value Do output from the A/D converting circuit 102 accurately shows an input voltage Vi of the A/D converting circuit 102 (an output voltage of an amplifier 100). Therefore, even though the ROM 112 for outputting a digital value of a measured value of the reference voltage Vr is not provided thereto, the microcontroller 18 can obtain the digital value accurately showing the input voltage Vi of the A/D converting circuit 102 at all times.

As described above, the same effect as that of the first embodiment can be obtained according to the second embodiment as well. Moreover, since the adder 200 is provided inside the A/D converter 26, it is possible to eliminate the need for the operation of the microcontroller 18 adding the digital value from the A/D converting circuit 102 and the digital value from the ROM 110. Therefore, it is possible to contribute to simplification of a control program of the microcontroller 18.

Figure 7:
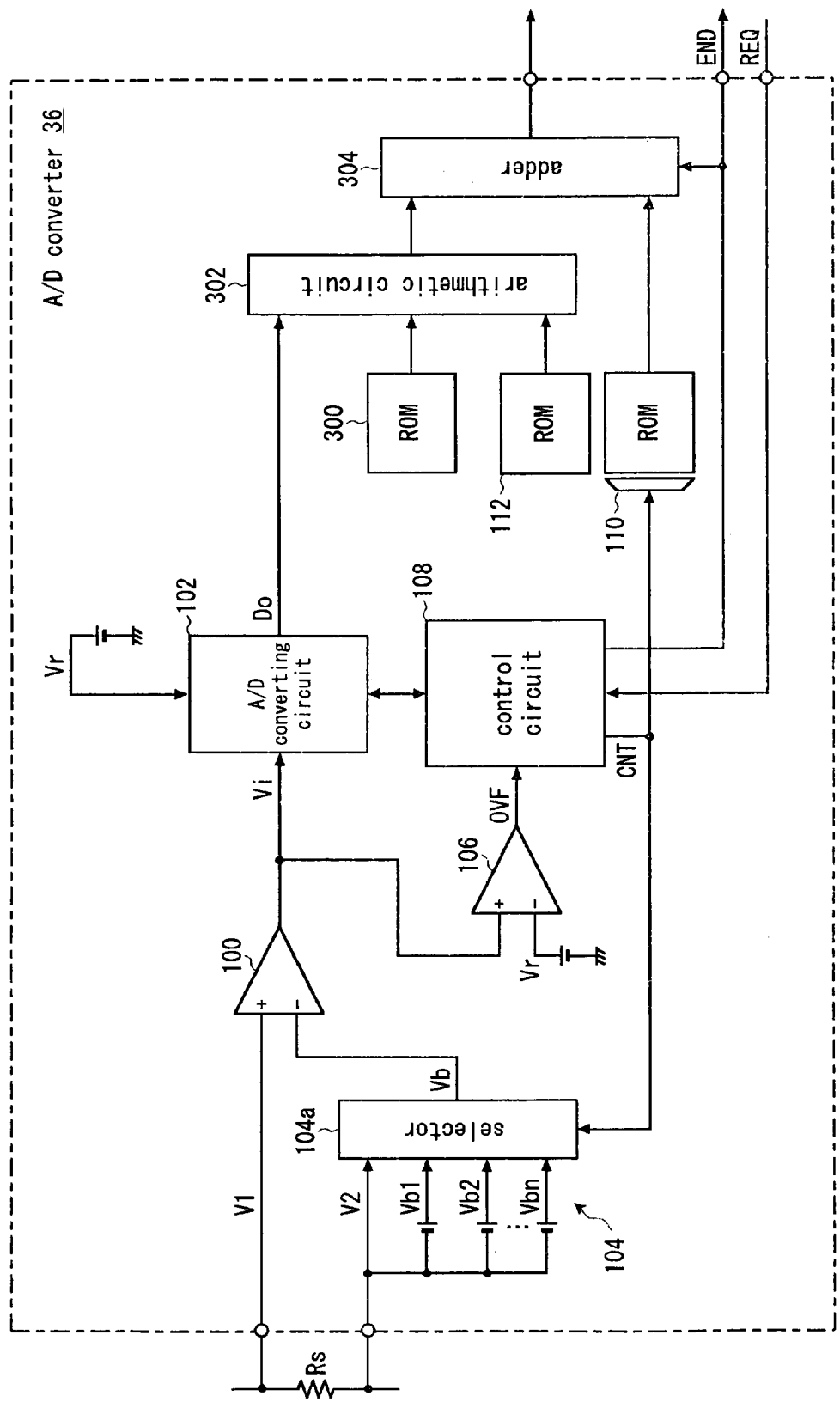
FIG. 7 is a block diagram showing a third embodiment of the present invention.

FIG. 7 shows a third embodiment of the present invention. In explaining the third embodiment, the same numerals and symbols are given to designate elements which are the same as those explained in the first embodiment, and detailed explanations thereof will be omitted. An A/D converter 36 is, for example, constituted as a semiconductor integrated circuit chip, and is mounted on a main portion of a notebook personal computer, similarly to the A/D converter 16 in the first embodiment (FIG. 2). The A/D converter 36 is constituted by adding a ROM 300 (a third storing circuit), an arithmetic circuit 302 (a correcting circuit), and an adder 304 (an adding circuit) to the A/D converter 16 in the first embodiment.

The ROM 300 is a nonvolatile memory such as a fuse and an EEPROM, similarly to ROMs 110 and 112, and it stores a 10-bit digital value showing a standard value of a reference voltage Vr in advance and outputs the stored digital value to the arithmetic circuit 302. During a probe inspection in a fabrication process of the A/D converter 36, for example, the standard value of the reference voltage Vr is written into the ROM 300, along with writing of data into the ROM 110 and writing of data into the ROM 112.

Based on the digital value from the ROM 112 and the digital value from the ROM 300, the arithmetic circuit 302 corrects a digital value from an A/D converting circuit 102 to be a digital value with reference to the standard value of the reference voltage Vr, and outputs it. The corrected digital value Do' can be expressed by the following expression (2), using a measured value X1 and a standard value X2 of the reference voltage Vr, and hence the arithmetic circuit 302 can be constituted easily by using a multiplying circuit and a dividing circuit.

$$Do'=(X2/X1) \times Do \qquad (2)$$

The adder 304 adds the digital value from the arithmetic circuit 302 and the digital value from the ROM 300, and outputs the added result as a 14-bit digital value to a microcontroller.

As described above, the same effect as that of the first embodiment can be obtained according to the third embodiment as well. Moreover, since the ROM 300, the arithmetic circuit 302 and the adder 304 are provided inside the A/D converter 36, it is possible to eliminate the need for the operation of the microcontroller 18 correcting the digital value from the A/D converting circuit 102 by using the digital value from the ROM 112, and adding the corrected digital value and the digital value from the ROM 110. Therefore, it is possible to contribute to simplification of a control program of the microcontroller 18.

Figure 8:
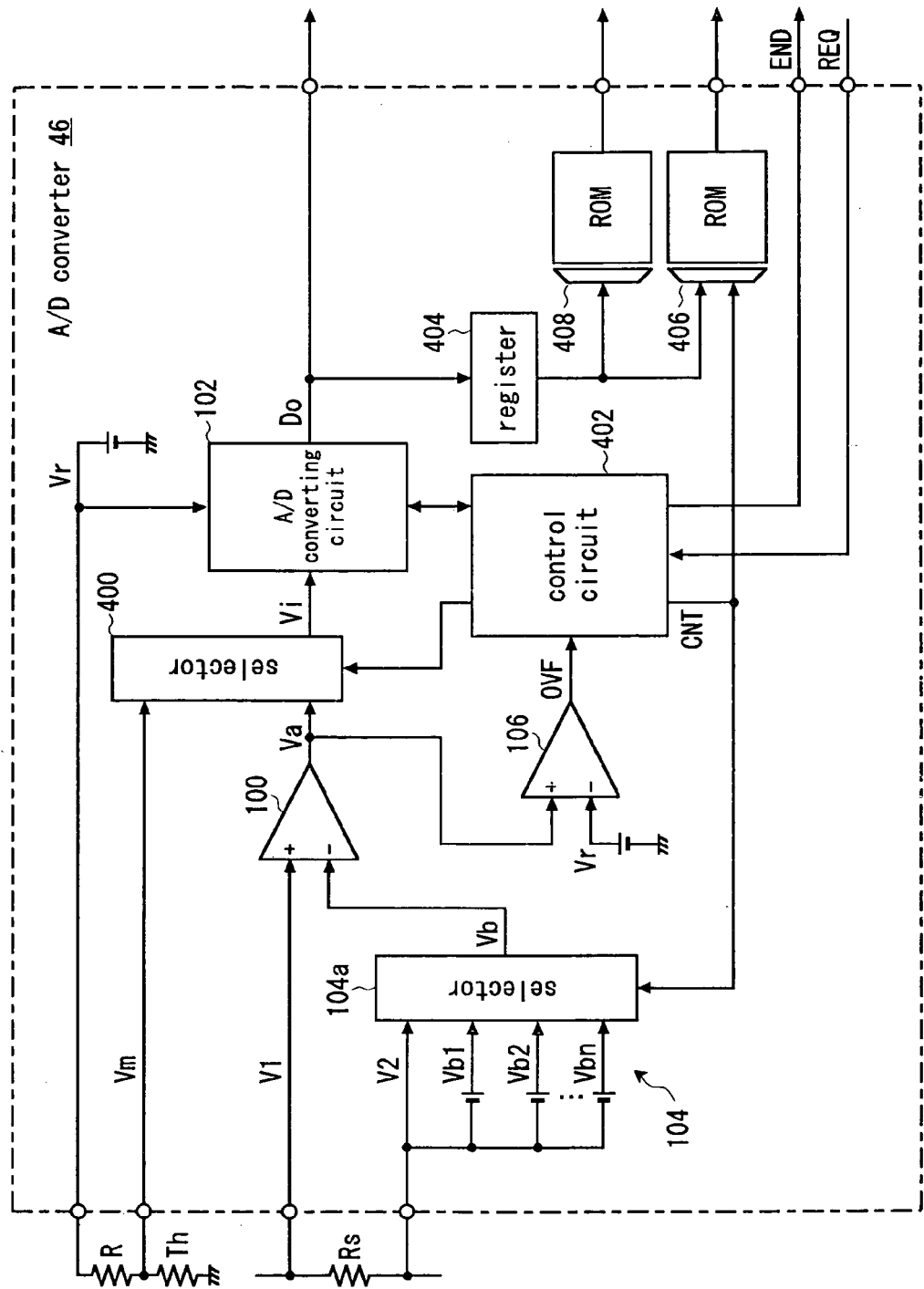
FIG. 8 is a block diagram showing a fourth embodiment of the present invention.

FIG. 8 shows a fourth embodiment of the present invention. In explaining the fourth embodiment, the same numerals and symbols are given to designate elements which are the same as those explained in the first embodiment, and detailed explanations thereof will be omitted. An A/D converter 46 is, for example, constituted as a semiconductor integrated circuit chip, and is mounted on a main portion of a notebook personal computer, similarly to the A/D converter 16 in the first embodiment (FIG. 2). The A/D converter 46 includes an amplifier 100, an A/D converting circuit 102, a bias circuit 104, a voltage comparator 106, a selector 400 (a selecting circuit), a control circuit 402, a resister 404 (a holding circuit), a ROM 406 (a first storing circuit), a ROM 408 (a second storing circuit), an external high-accuracy resistor R, and an external thermistor Th (a measurement voltage generating circuit).

The high-accuracy resistor R and the thermistor Th are connected in series between a supply line of a reference voltage Vr and a ground line. A voltage at a connecting node between the high-accuracy resistor R and the thermistor Th is output as a measurement voltage Vm to the selector. The high-accuracy resistor R is temperature-independent. In other words, a resistance value of the high-accuracy resistor R is substantially constant irrespective of ambient temperature around the A/D converter 46. The thermistor Th is temperature-dependent. In other words, a resistance value of the thermistor Th changes in response to the ambient temperature around the A/D converter 46. Therefore, the measurement voltage Vm fluctuates according to temperature characteristics of the thermistor Th, namely, it fluctuates in response to the ambient temperature around the A/D converter 46. Such a measurement voltage Vm can be expressed by the following expression (3).

$$Vm=\{Th/(R+Th)\}\times Vr \quad (3)$$

The selector 400 follows an instruction from the control circuit 402 to select either the measurement voltage Vm or an output voltage Va of the amplifier 100, and output the selected voltage as an input voltage Vi of the A/D converting circuit 102. The control circuit 402 responds to activation of a conversion request signal REQ output from a microcontroller 18 to instruct the selector 400 to select the measurement voltage Vm, and thereafter, instruct the selector 400 to select the output voltage Va of the amplifier 100. Moreover, the control circuit 402 instructs the A/D converting circuit 102 to start A/D conversion, together with the selecting instruction to the selector 400. The rest of the operation of the control circuit 402 is the same as that of the control circuit 108 in the first embodiment.

The resister 404 takes in a digital value Do which is output from the A/D converting circuit 102, each time the A/D converting circuit 102 performs the A/D conversion of the measurement voltage Vm. The digital value Do (a resister value of the resister 404) accompanying the A/D conversion of the measurement voltage Vm can be expressed by the following expression (4). Since the resistor value of the high-accuracy resistor R can be considered to be a constant, the digital value Do accompanying the A/D conversion of the measurement voltage Vm is dependent only on the resistor value of the thermistor Th, that is, the ambient temperature around the A/D converter 46. Therefore, the digital value Do accompanying the A/D conversion of the measurement voltage Vm can be used as temperature information showing the ambient temperature around the A/D converter 46.

$$Do=\{Th/(R+Th)\}\times 1024 \quad (4)$$

The ROM 406 is a nonvolatile memory such as a fuse and an EEPROM, in which, for every ambient temperature around the A/D converter 46, n-pieces of 14-bit digital values corresponding respectively to n bias voltages of the bias circuit 104 and a 14-bit digital value corresponding to a voltage V2, all of whose bits are "0", are stored in advance. For example, each of the digital values stored in the ROM 406 shows the value multiplying a measured value of the corresponding bias voltage by an amplification factor of the amplifier 100. The ROM 406 selects the digital value corresponding to the temperature shown by the resister value of the resister 404, out of the digital values corresponding to the value shown by a counter value signal CNT output from the control circuit 402, that is, the digital values corresponding to each of voltages Vb1 to Vbn selected by a selector 104a of the bias circuit 104, and outputs it to the microcontroller 18.

The ROM 408 is a nonvolatile memory such as a fuse and an EEPROM, similarly to the ROM 406, in which 10-bit digital values showing measured values of the reference voltage Vr at every ambient temperature around the A/D converter 46 are stored in advance. The ROM 408 selects the digital value corresponding to the temperature shown by the resister value of the resister 404 and outputs it to the microcontroller 18. It should be noted that, although not illustrated, the A/D converter 46 includes, for example, monitoring pads for monitoring the reference voltage Vr, the voltages Vb1 to Vbn, and the output voltage Va of the amplifier 100, respectively, writing pads and writing circuits for writing data into the ROMs 406 and 408, similarly to the A/D converter 16 in the first embodiment. While changing temperature condition, the measured values of the reference voltage Vr and the measured values of the voltages Vb1 to Vbn (corresponding to the measured values of the bias voltages) are obtained via the monitoring pads during a probe inspection in a fabrication process of the A/D converter 46. The value multiplying the measured value of each bias voltage by the amplification factor of the amplifier 100, corresponding to the ambient temperature, is written into the ROM 406, and the measured value of the reference voltage Vr, corresponding to the ambient temperature, is written into the ROM 408 via the writing pads and the writing circuits. Incidentally, the amplification factor of the amplifier 100 is determined based on a measured value of the output voltage Va of the amplifier 100 which is obtained via the monitoring pad.

As described above, the same effect as that of the first embodiment can be obtained according to the fourth embodiment as well. Moreover, since both of the digital values from the ROMs 406 and 408 show the values corresponding to the current ambient temperature around the A/D converter 46, it is possible for the microcontroller 18 to obtain the digital value accurately showing a voltage difference between both ends of the resistor Rs at all times, even when the reference voltage Vr and the bias voltages fluctuate according to fluctuation of the ambient temperature around the A/D converter 46.

Figure 9:
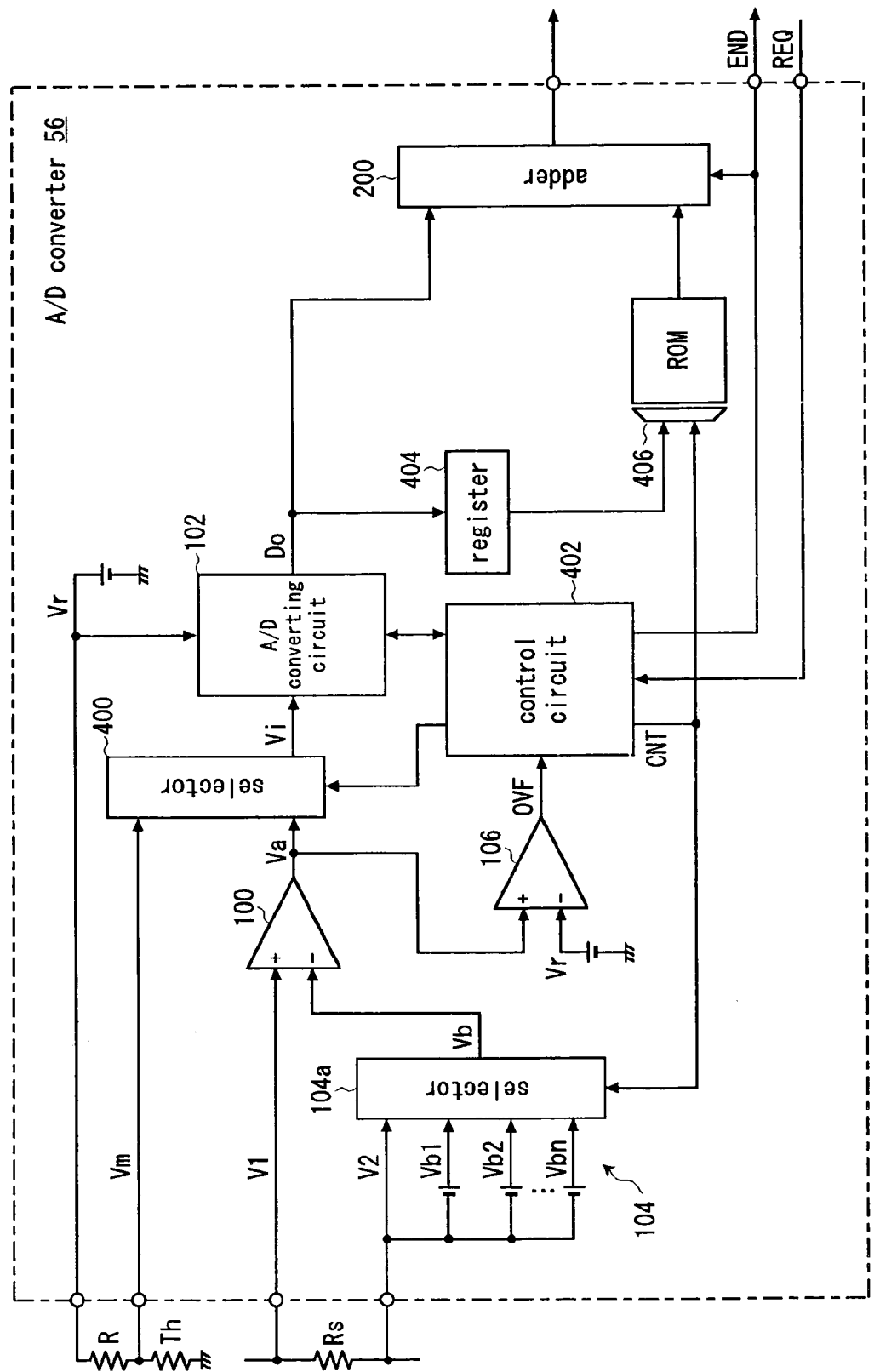
FIG. 9 is a block diagram showing a fifth embodiment of the present invention.

FIG. 9 shows a fifth embodiment of the present invention. In explaining the fifth embodiment, the same numerals and symbols are given to designate elements which are the same as those explained in the first, second and fourth embodiments, and detailed explanations thereof will be omitted. An A/D converter 56 is, for example, constituted as a semiconductor integrated circuit chip and is mounted on a main portion of a notebook personal computer, similarly to the A/D converter 16 in the first embodiment (FIG. 2). The A/D converter 56 is constituted by removing the ROM 408 from the A/D converter 46 in the fourth embodiment (FIG. 8), and adding the adder 200 in the second embodiment (FIG. 6) thereto. As described above, the same effect as those of the first, second and fourth embodiments can be obtained according to the fifth embodiment as well.

Figure 10:
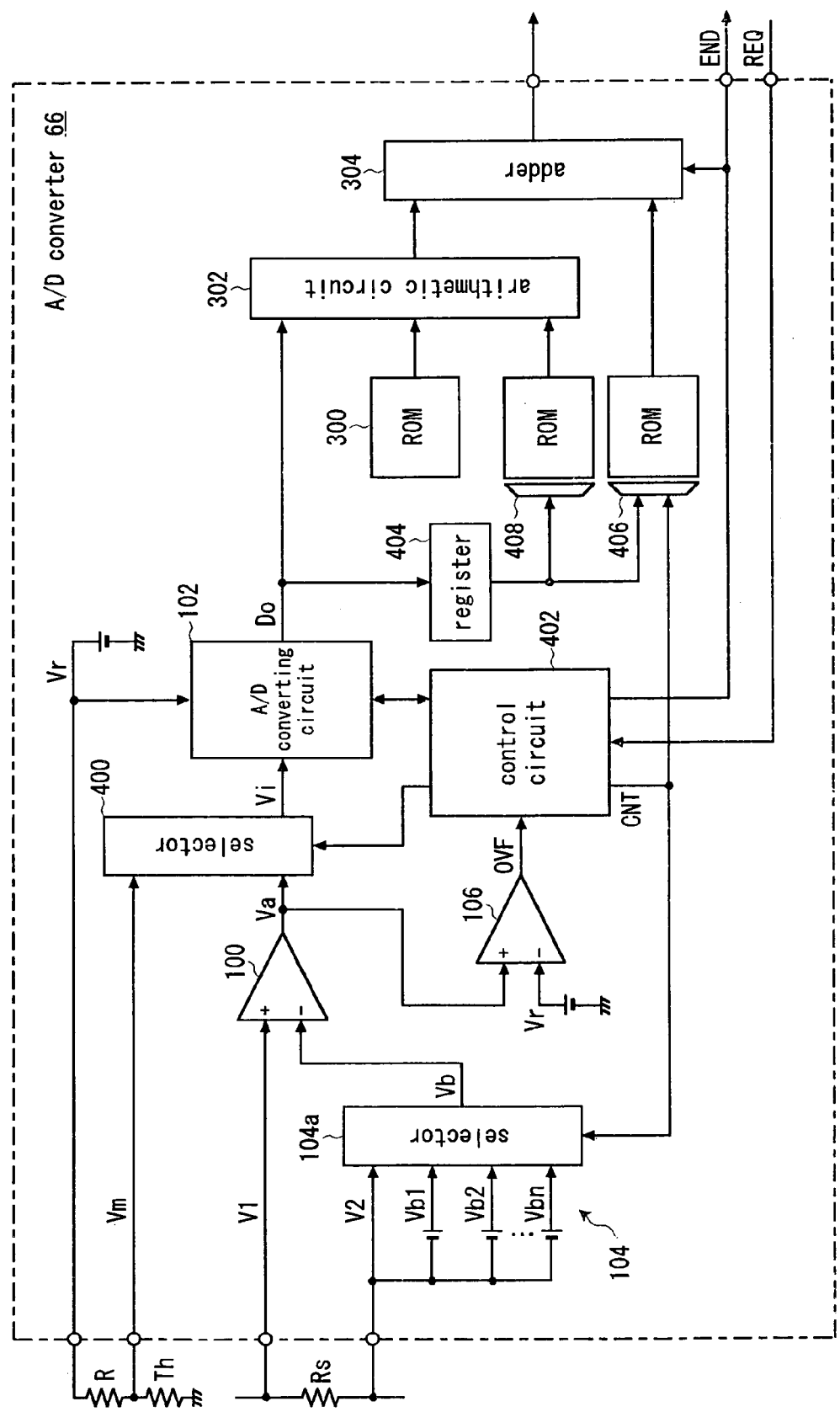
FIG. 10 is a block diagram showing a sixth embodiment of the present invention.
Figure 11:
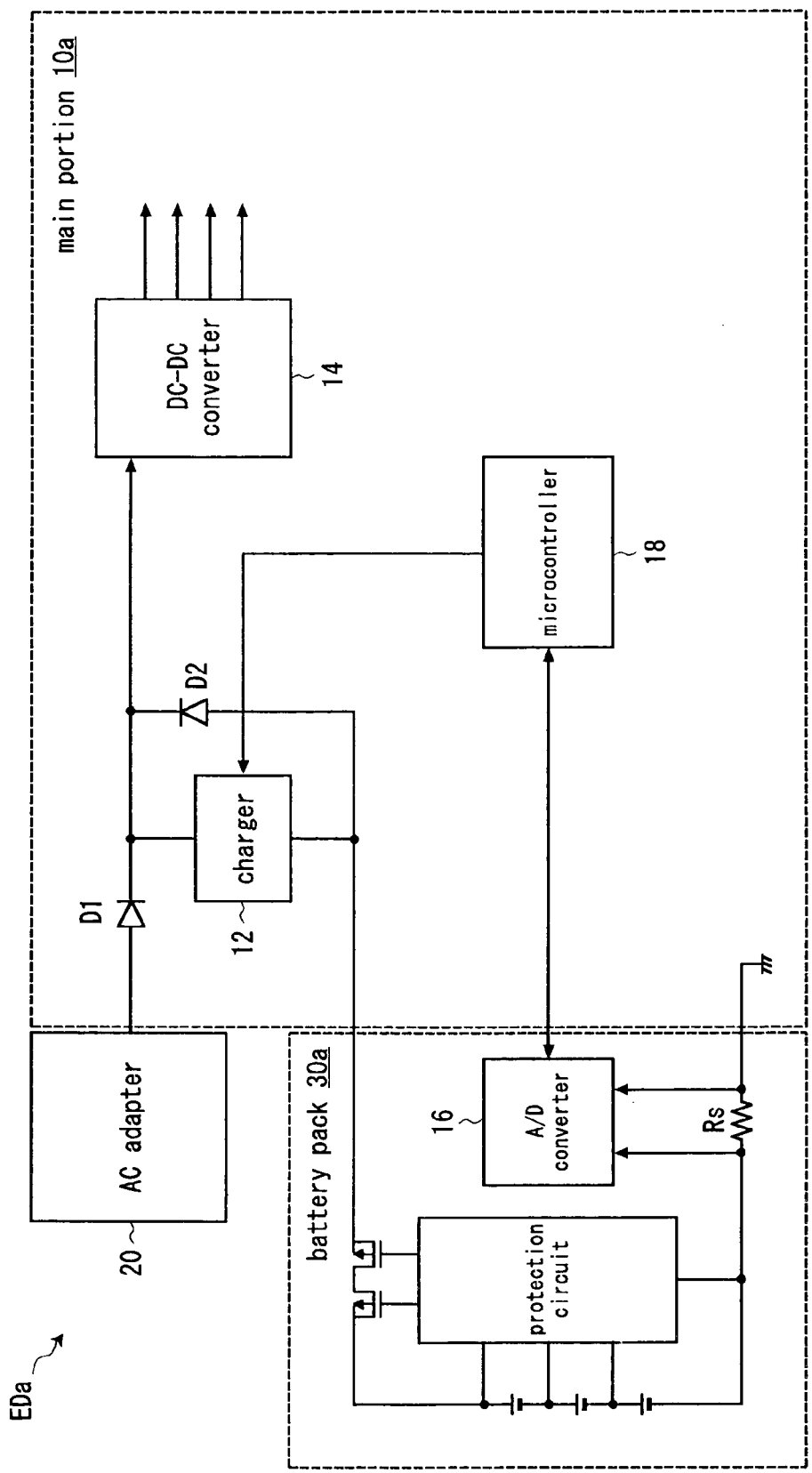
FIG. 11 is a block diagram showing a seventh embodiment of the present invention.

FIG. 10 shows a sixth embodiment of the present invention. In explaining the sixth embodiment, the same numerals and symbols are given to designate elements which are the same as those explained in the first, third and fourth embodiments, and detailed explanations thereof will be omitted. An A/D converter 66 is, for example, constituted as a semiconductor integrated circuit chip and is mounted on a main portion of a notebook personal computer, similarly to the A/D converter 16 in the first embodiment (FIG. 2). The A/D converter 66 is constituted by adding the ROM 300, the arithmetic circuit 302 and the adder 304 in the third embodiment (FIG. 7) to the A/D converter 46 in the fourth embodiment (FIG. 8). As described above, the same effect as those of the first, third and fourth embodiments can be obtained according to the sixth embodiment as well.

FIG. 111 shows a seventh embodiment of the present invention. In explaining the seventh embodiment, the same numerals and symbols are given to designate elements which are the same as those explained in the first embodiment, and detailed explanations thereof will be omitted. A portable electronics device (a notebook personal computer, for example) EDa is constituted by including a main portion 10a, an AC adapter 20, and a battery pack 30a. The main portion 10a is constituted by removing the resistor Rs and the A/D converter 16 from the main portion 10 in the first embodiment (FIG. 1). The battery pack 30a is constituted by adding the resistor Rs and the A/D converter 16 to the battery pack 30 in the first embodiment. As described above, the same effect as that of the first embodiment can be obtained according to the seventh embodiment as well.

Incidentally, the example of the battery pack 30a constituted by including the A/D converter 16 in the first embodiment is described according to the seventh embodiment. However, the present invention is not limited to such an embodiment. For example, the battery pack 30a may be constituted by including any one of the A/D converters 26, 36, 46, 56 and 66 in the second to sixth embodiments, instead of the A/D converter 16.

The invention is not limited to the above embodiments and various modifications may be made without departing from the spirit and scope of the invention. Any improvement may be made in part or all of the components.

What is claimed is:

1. An A/D converter comprising:
    an amplifying circuit amplifying a voltage difference between a first external input voltage and a voltage corresponding to a second external input voltage, and outputting the amplified voltage;
    an A/D converting circuit converting the output voltage of said amplifying circuit into a digital value by making a comparison with a reference voltage, and outputting the resultant digital value;
    a bias circuit selecting either the second external input voltage or a voltage obtained by adding a bias voltage to the second external input voltage, according to the output voltage of said amplifying circuit, in order to prevent the output voltage of said amplifying circuit from falling outside an A/D convertible range of said A/D converting circuit, and outputting the selected voltage as the voltage corresponding to the second external input voltage; and
    a first storing circuit storing a measured value of the bias voltage in advance, and outputting the stored measured value as a digital value whose bit number is greater than that of the digital value from said A/D converting circuit, when the voltage corresponding to the second external input voltage is the voltage obtained by adding the bias voltage to the second external input voltage.

2. The A/D converter according to claim 1, further comprising:
    a second storing circuit storing a measured value of the reference voltage in advance, and outputting the stored measured value as a digital value.

3. The A/D converter according to claim 2, further comprising:
    a third storing circuit storing a standard value of the reference voltage in advance, and outputting the stored standard value as a digital value;
    a correcting circuit correcting the digital value from said A/D converting circuit to be a digital value which is based on the standard value of the reference voltage, in accordance with the digital values from said second and third storing circuits, and outputting the corrected digital value; and
    an adding circuit adding the digital value from said correcting circuit and the digital value from said first storing circuit, and outputting the added result.

4. The A/D converter according to claim 1, further comprising
    an adding circuit adding the digital value from said A/D converting circuit and the digital value from said first storing circuit, and outputting the added result.

5. The A/D converter according to claim 1, wherein:
    said bias circuit selects the bias voltage to be added to the second external input voltage out of a plurality of bias voltages according to the output voltage of said amplifying circuit; and
    said first storing circuit stores measured values of the plurality of bias voltages in advance, selects the corresponding measured value of the bias voltage which has been selected by said bias circuit, and outputs the selected value as the digital value.

6. The A/D converter according to claim 5, further comprising:
    a measurement voltage generating circuit generating a measurement voltage for measuring temperature which fluctuates in response to ambient temperature around said A/D converter;
    a selecting circuit selecting and outputting the measurement voltage and thereafter the output voltage of said amplifying circuit as an input voltage of said A/D converting circuit; and
    a holding circuit holding the digital value which is output from said A/D converting circuit in association with the selection of the measurement voltage by said selecting circuit, wherein
    said first storing circuit stores the measured values of the plurality of bias voltages at every ambient temperature around said A/D converter in advance, selects the measured value corresponding to the digital value held by said holding circuit out of the measured values of the bias voltage which has been selected by said bias circuit, and outputs the selected value as a digital value.

7. The A/D converter according to claim 6, further comprising:
    a second storing circuit storing measured values of the reference voltage at every ambient temperature around said A/D converter in advance, selecting the measured value corresponding to the digital value held by said holding circuit, and outputting the selected value as a digital value.

8. The A/D converter according to claim 7, further comprising:
    a third storing circuit storing a standard value of the reference voltage in advance, and outputting the stored standard value as a digital value;
    a correcting circuit correcting the digital value from said A/D converting circuit to be a digital value which is based on the standard value of the reference voltage, in accordance with the digital values from said second and third storing circuits, and outputting the corrected digital value; and
    an adding circuit adding the digital value from said correcting circuit and the digital value from said first storing circuit, and outputting the added result.

9. The A/D converter according to claim 6, further comprising
    an adding circuit adding the digital value from said A/D converting circuit and the digital value from said first storing circuit, and outputting the added result.

10. A battery pack comprising:
    an A/D converter provided to measure a voltage difference between a first and a second external input voltages which are generated at both ends of a resistor element inserted in a current path in series, wherein
    said A/D converter includes
    an amplifying circuit amplifying a voltage difference between the first external input voltage and a voltage corresponding to the second external input voltage, and outputting the amplified voltage, an A/D converting circuit converting the output voltage of said amplifying circuit into a digital value by making a comparison with a reference voltage, and outputting the resultant digital value, a bias circuit selecting either the second external input voltage or a voltage obtained by adding a bias voltage to the second external input voltage, according to the output voltage of said amplifying circuit, in order to prevent the output voltage of said amplifying circuit from falling outside an A/D convertible range of said A/D converting circuit, and outputting the selected voltage as the voltage corresponding to the second external input voltage, and a first storing circuit storing a measured value of the bias voltage in advance, and outputting the stored measured value as a digital value whose bit number is greater than that of the digital value from said A/D converting circuit, when the voltage corresponding to the second external input voltage is the voltage obtained by adding the bias voltage to the second external input voltage.

11. The battery pack according to claim 10, wherein said A/D converter includes a second storing circuit storing a measured value of the reference voltage in advance, and outputting the stored measured value as a digital value.

12. The battery pack according to claim 11, wherein said A/D converter includes:

a third storing circuit storing a standard value of the reference voltage in advance, and outputting the stored standard value as a digital value;

a correcting circuit correcting the digital value from said A/D converting circuit to be a digital value which is based on the standard value of the reference voltage, in accordance with the digital values from said second and third storing circuits, and outputting the corrected digital value; and an adding circuit adding the digital value from said correcting circuit and the digital value from said first storing circuit, and outputting the added result.

13. The battery pack according to claim 10, wherein said A/D converter includes an adding circuit adding the digital value from said A/D converting circuit and the digital value from said first storing circuit, and outputting the added result.

14. The battery pack according to claim 10, wherein:

said bias circuit selects the bias voltage to be added to the second external input voltage out of a plurality of bias voltages according to the output voltage of said amplifying circuit; and said first storing circuit stores measured values of the plurality of bias voltages in advance, selects the corresponding measured value of the bias voltage which has been selected by said bias circuit, and outputs the selected value as the digital value.

15. The battery pack according to claim 14, wherein said A/D converter includes:

a measurement voltage generating circuit generating a measurement voltage for measuring temperature which fluctuates in response to ambient temperature around said A/D converter;

a selecting circuit selecting and outputting the measurement voltage and thereafter the output voltage of said amplifying circuit as an input voltage of said A/D converting circuit; and a holding circuit holding the digital value which is output from said A/D converting circuit in association with the selection of the measurement voltage by said selecting circuit, and wherein said first storing circuit stores the measured values of the plurality of bias voltages at every ambient temperature around said A/D converter in advance, selects the measured value corresponding to the digital value held by said holding circuit out of the measured values of the bias voltage which has been selected by said bias circuit, and outputs the selected value as a digital value.

16. The battery pack according to claim 15, wherein said A/D converter includes a second storing circuit storing measured values of the reference voltage at every ambient temperature around said A/D converter in advance, selecting the measured value corresponding to the digital value held by said holding circuit, and outputting the selected value as a digital value.

17. The battery pack according to claim 16, wherein said A/D converter includes:

a third storing circuit storing a standard value of the reference voltage in advance, and outputting the stored standard value as a digital value;

a correcting circuit correcting the digital value from said A/D converting circuit to be a digital value which is based on the standard value of the reference voltage, in accordance with the digital values from said second and third storing circuits, and outputting the corrected digital value; and an adding circuit adding the digital value from said correcting circuit and the digital value from said first storing circuit, and outputting the added result.

18. The battery pack according to claim 15, wherein said A/D converter includes an adding circuit adding the digital value from said A/D converting circuit and the digital value from said first storing circuit, and outputting the added result.

19. An electronics device comprising:

an A/D converter provided to measure a voltage difference between a first and a second external input voltages which are generated at both ends of a resistor element inserted in a current path in series; and a current measuring circuit determining a current value of the current path based on a digital value from said A/D converter, wherein said A/D converter includes an amplifying circuit amplifying a voltage difference between the first external input voltage and a voltage corresponding to the second external input voltage, and outputting the amplified voltage, an A/D converting circuit converting the output voltage of said amplifying circuit into a digital value by making a comparison with a reference voltage, and outputting the resultant digital value, a bias circuit selecting either the second external input voltage or a voltage obtained by adding a bias voltage to the second external input voltage, according to the output voltage of said amplifying circuit, in order to prevent the output voltage of said amplifying circuit from falling outside an A/D convertible range of said A/D converting circuit, and outputting the selected voltage as the voltage corresponding to the second external input voltage, and a first storing circuit storing a measured value of the bias voltage in advance, and outputting the stored measured value as a digital value whose bit number is greater than that of the digital value from said A/D converting circuit, when the voltage corresponding to the second external input voltage is the voltage obtained by adding the bias voltage to the second external input voltage.

20. The electronics device according to claim 19, wherein said A/D converter includes a second storing circuit storing a measured value of the reference voltage in advance, and outputting the stored measured value as a digital value.

21. The electronics device according to claim 20, wherein said A/D converter includes:
a third storing circuit storing a standard value of the reference voltage in advance, and outputting the stored standard value as a digital value;
a correcting circuit correcting the digital value from said A/D converting circuit to be a digital value which is based on the standard value of the reference voltage, in accordance with the digital values from said second and third storing circuits, and outputting the corrected digital value; and
an adding circuit adding the digital value from said correcting circuit and the digital value from said first storing circuit, and outputting the added result.

22. The electronics device according to claim 19, wherein said A/D converter includes an adding circuit adding the digital value from said A/D converting circuit and the digital value from said first storing circuit, and outputting the added result.

23. The electronics device according to claim 19, wherein:
said bias circuit selects the bias voltage to be added to the second external input voltage out of a plurality of bias voltages according to the output voltage of said amplifying circuit; and
said first storing circuit stores measured values of the plurality of bias voltages in advance, selects the corresponding measured value of the bias voltage which has been selected by said bias circuit, and outputs the selected value as the digital value.

24. The electronics device according to claim 23, wherein said A/D converter includes:
a measurement voltage generating circuit generating a measurement voltage for measuring temperature which fluctuates in response to ambient temperature around said A/D converter;
a selecting circuit selecting and outputting the measurement voltage and thereafter the output voltage of said amplifying circuit as an input voltage of said A/D converting circuit; and
a holding circuit holding the digital value which is output from said A/D converting circuit in association with the selection of the measurement voltage by said selecting circuit, and wherein
said first storing circuit stores the measured values of the plurality of bias voltages at every ambient temperature around said A/D converter in advance, selects the measured value corresponding to the digital value held by said holding circuit out of the measured values of the bias voltage which has been selected by said bias circuit, and outputs the selected value as a digital value.

25. The electronics device according to claim 24, wherein said A/D converter includes a second storing circuit storing measured values of the reference voltage at every ambient temperature around said A/D converter in advance, selecting the measured value corresponding to the digital value held by said holding circuit, and outputting the selected value as a digital value.

26. The electronics device according to claim 25, wherein said A/D converter includes:
a third storing circuit storing a standard value of the reference voltage in advance, and outputting the stored standard value as a digital value;
a correcting circuit correcting the digital value from said A/D converting circuit to be a digital value which is based on the standard value of the reference voltage, in accordance with the digital values from said second and third storing circuits, and outputting the corrected digital value; and
an adding circuit adding the digital value from said correcting circuit and the digital value from said first storing circuit, and outputting the added result.

27. The electronics device according to claim 24, wherein said A/D converter includes an adding circuit adding the digital value from said A/D converting circuit and the digital value from said first storing circuit, and outputting the added result.

28. An electronics device comprising:
a battery pack including an A/D converter provided to measure a voltage difference between a first and a second external input voltages which are generated at both ends of a resistor element inserted in a current path in series; and
a current measuring circuit determining a current value of the current path based on a digital value from said A/D converter of said battery pack, wherein
said A/D converter includes
an amplifying circuit amplifying a voltage difference between the first external input voltage and a voltage corresponding to the second external input voltage, and outputting the amplified voltage,
an A/D converting circuit converting the output voltage of said amplifying circuit into a digital value by making a comparison with a reference voltage, and outputting the resultant digital value,
a bias circuit selecting either the second external input voltage or a voltage obtained by adding a bias voltage to the second external input voltage, according to the output voltage of said amplifying circuit, in order to prevent the output voltage of said amplifying circuit from falling outside an A/D convertible range of said A/D converting circuit, and outputting the selected voltage as the voltage corresponding to the second external input voltage, and
a first storing circuit storing a measured value of the bias voltage in advance, and outputting the stored measured value as a digital value whose bit number is greater than that of the digital value from said A/D converting circuit, when the voltage corresponding to the second external input voltage is the voltage obtained by adding the bias voltage to the second external input voltage.

29. The electronics device according to claim 28, wherein said A/D converter includes a second storing circuit storing a measured value of the reference voltage in advance, and outputting the stored measured value as a digital value.

30. The electronics device according to claim 29, wherein said A/D converter includes:
a third storing circuit storing a standard value of the reference voltage in advance, and outputting the stored standard value as a digital value;
a correcting circuit correcting the digital value from said A/D converting circuit to be a digital value which is based on the standard value of the reference voltage, in accordance with the digital values from said second and third storing circuits, and outputting the corrected digital value; and an adding circuit adding the digital value from said correcting circuit and the digital value from said first storing circuit, and outputting the added result.

31. The electronics device according to claim 28, wherein said A/D converter includes an adding circuit adding the digital value from said A/D converting circuit and the digital value from said first storing circuit, and outputting the added result.

32. The electronics device according to claim 28, wherein:

said bias circuit selects the bias voltage to be added to the second external input voltage out of a plurality of bias voltages according to the output voltage of said amplifying circuit; and said first storing circuit stores measured values of the plurality of bias voltages in advance, selects the corresponding measured value of the bias voltage which has been selected by said bias circuit, and outputs the selected value as the digital value.

33. The electronics device according to claim 32, wherein said A/D converter includes:

a measurement voltage generating circuit generating a measurement voltage for measuring temperature which fluctuates in response to ambient temperature around said A/D converter;

a selecting circuit selecting and outputting the measurement voltage and thereafter the output voltage of said amplifying circuit as an input voltage of said A/D converting circuit; and a holding circuit holding the digital value which is output from said A/D converting circuit in association with the selection of the measurement voltage by said selecting circuit, and wherein said first storing circuit stores the measured values of the plurality of bias voltages at every ambient temperature around said A/D converter in advance, selects the measured value corresponding to the digital value held by said holding circuit out of the measured values of the bias voltage which has been selected by said bias circuit, and outputs the selected value as a digital value.

34. The electronics device according to claim 33, wherein said A/D converter includes a second storing circuit storing measured values of the reference voltage at every ambient temperature around said A/D converter in advance, selecting the measured value corresponding to the digital value held by said holding circuit, and outputting the selected value as a digital value.

35. The electronics device according to claim 34, wherein said A/D converter includes:

a third storing circuit storing a standard value of the reference voltage in advance, and outputting the stored standard value as a digital value;

a correcting circuit correcting the digital value from said A/D converting circuit to be a digital value which is based on the standard value of the reference voltage, in accordance with the digital values from said second and third storing circuits, and outputting the corrected digital value; and an adding circuit adding the digital value from said correcting circuit and the digital value from said first storing circuit, and outputting the added result.

36. The electronics device according to claim 33, wherein said A/D converter includes an adding circuit adding the digital value from said A/D converting circuit and the digital value from said first storing circuit, and outputting the added result.

37. A method of voltage measurement comprising the steps of:

amplifying a voltage difference between a first external input voltage which is generated at one end of a resistor element inserted in a current path in series and a voltage corresponding to a second external input voltage which is generated at the other end of the resistor element;

performing A/D conversion of the amplified voltage;

selecting either the second external input voltage or a voltage obtained by adding a bias voltage to the second external input voltage as the voltage corresponding to the second external input voltage, according to the amplified voltage, in order to prevent the amplified voltage from falling outside an A/D convertible range;

outputting a measured value of the bias voltage which is stored in advance as a digital value whose bit number is greater than that of a digital value obtained by the A/D conversion, when the voltage corresponding to the second external input voltage is the voltage obtained by adding the bias voltage to the second external input voltage; and determining the voltage difference between both ends of the resistor element based on the digital value obtained by the A/D conversion and the digital value showing the measured value of the bias voltage.

38. An A/D converter comprising:

an amplifying circuit amplifying a voltage difference between a first external input voltage and a voltage corresponding to a second external input voltage, and outputting the amplified voltage;

an A/D converting circuit converting the output voltage of said amplifying circuit into a digital value by making a comparison with a reference voltage, and outputting the resultant digital value;

a bias circuit selecting either the second external input voltage or a voltage obtained by adding a bias voltage to the second external input voltage, according to the output voltage of said amplifying circuit, and outputting the selected voltage as the voltage corresponding to the second external input voltage; and a first storing circuit storing a measured value of the bias voltage in advanced, and outputting the stored measured value as a digital value, when the voltage corresponding to the second external input voltage is the voltage obtained by adding the bias voltage to the second external input voltage.

39. The A/D converter according to claim 38, wherein:

said digital value outputted by said first storing circuit has a bit number greater than that of the digital value from said A/D converting circuit.

40. A method of voltage measurement comprising the steps of:

amplifying a voltage difference between a first external input voltage which is generated at one end of a resistor element inserted in a current path in series and a voltage corresponding to a second external input voltage which is generated at the other end of the resistor element;

performing A/D conversion of the amplified voltage;

selecting either a second external input voltage or a voltage obtained by adding a bias voltage to the second external input voltage as the voltage corresponding to the second external input voltage, according to the amplified voltage;

outputting a measured value of the bias voltage which is stored in advance as a digital value, when the voltage corresponding to the second external input voltage is the voltage obtained by adding the bias voltage to the second external input voltage; and determining the voltage difference between both ends of the resistor element based on the digital value obtained by the A/D conversion and the digital value showing the measured value of the bias voltage.

41. A method of voltage measurement according to claim 40, wherein:

said digital value in said outputting step has a bit number greater than that of a digital value obtained by the A/D conversion.

* * * * *

UNITED STATES PATENT AND TRADEMARK OFFICE
CERTIFICATE OF CORRECTION

| | | |
|---|---|---|
| PATENT NO. | : 7,012,558 B1 | Page 1 of 1 |
| APPLICATION NO. | : 11/023593 | |
| DATED | : March 14, 2006 | |
| INVENTOR(S) | : Kazuyoshi Arimura et al. | |

It is certified that error appears in the above-identified patent and that said Letters Patent is hereby corrected as shown below:

Title Page -

Item [75] Inventor, please correct the third inventor's name to read as follows:

-- Hidekiyo OZAWA --.

Signed and Sealed this

Sixth Day of February, 2007

JON W. DUDAS
*Director of the United States Patent and Trademark Office*